Dec. 24, 1968 P. G. PEROTTO 3,418,533

MODULAR STRUCTURE FOR ELECTRONIC INTEGRATED CIRCUITS

Filed Dec. 19, 1966

3 Sheets-Sheet 1

INVENTOR.
PIER GIORGIO PEROTTO

BY Shoemaker and Mattare
ATTORNEYS

INVENTOR.
PIER GIORGIO PEROTTO
BY Shoemaker and Mattare
ATTORNEYS

Dec. 24, 1968 P. G. PEROTTO 3,418,533

MODULAR STRUCTURE FOR ELECTRONIC INTEGRATED CIRCUITS

Filed Dec. 19, 1966

3 Sheets-Sheet 3

*INVENTOR.*
PIER GIORGIO PEROTTO

BY Shoemaker and Mattare
ATTORNEYS

3,418,533

MODULAR STRUCTURE FOR ELECTRONIC INTEGRATED CIRCUITS

Pier Giorgio Perotto, Turin, Italy, assignor to Ing. C. Olivetti & C., S.p.A., Ivrea, Italy, a corporation of Italy Filed Dec. 19, 1966, Ser. No. 602,778
Claims priority, application Italy, Dec. 24, 1965, 29,057/65
5 Claims. (Cl. 317—100)

ABSTRACT OF THE DISCLOSURE

In a modular structure for electronic integrated circuit a set of parallelly disposed and detachable main boards, carrying interconnected active and/or passive electronic components, are electrically interconnected through connection boards interposed therebetween and contacting superficial contact elements carried by said main boards and distributed on the whole surface of each face thereof.

The present invention relates to a modular structure for electronic integrated circuits, for example for electronic computers, and more particularly of the type comprising a set of parallelly disposed and detachable main boards, each one carrying interconnected active and/or passive electronic components.

One of the major problems that the electronic technology has actually to face is the "packaging" one, which involves the technology of manufacturing, protecting, supporting and cooling circuit assemblies.

To this end the known technique applies to the so-called "integration" of the circuits, which developed on several degrees and on several directions, starting from the conventional technology wherein the different electronic components (for example transistors, diodes, capacitors and resistors) maintain their entire physical individuality.

A first known type of integration gives rise to an electronic system consisting of a plurality of stacked boards of insulating material, each one carrying at least on one face a printed circuit wherewith a plurality of modular circuits are connected.

Said modular circuits may be of the type comprising a relatively small plate of insulating material adapted to support some active and passive electronic components which are connected to a printed circuit carried by a face of said plate, and have their free terminals located perpendicularly with respect to said plate, so that said modular circuits appear as parallelepipeds applied to said boards.

This integration type results to be very economical, but it does not assure a sufficient packaging and furthermore it requires a remarkable assembling and soldering work for the components.

In a second known integration type said modular circuits are made of so-called integrated microcircuits wherein a remarkable number of active and passive electronic components and the relative interconnections are physically integrated into monolithic blocks of semiconductors. Said monolithic blocks are normally encapsulated, according to the known techniques used for the conventional individual transistors, in containers having a large number of terminals projecting therefrom which badly fit for the connection with external circuits.

Therefore said second integration type, which allows an advantageous packaging in the range of each modular circuit, introduces heavy assembly and interconnection problems of the modules, such as to practically compromise the possibility of a sufficient total packaging of the circuit assembly. Furthermore, with the aim of obtaining the advantage of the packaging, said microcircuits are constructed in such a manner as to comprehend a large number of components, and therefore, they result very intricated and expensive; furthermore, due to this structure, they result very specialized as to their function, whereby the interconnection of a microcircuit with the others is not fit to be accomplished according to geometrically simple and easy automatic executable schemes. Finally, a system using microcircuits presents complex even problems both for the cooling and for the operation reliability.

Finally, in a third known integration type relatively small plates are employed whereon a large number of electronic components, including the interconnection therebetween, are obtained by means of deposition techniques or the like. It is known that the problem of obtaining by means of these techniques also the active components has not yet been solved in a practically satisfactory manner, whereby separate individual active components are applied to said plates.

In the known above mentioned integration systems the electric connection between the different boards is carried out by joining contact tabs located on an edge of said boards, according to an interconnection technique substantially not different from the one used to interconnect the conventional printed circuits. This interconnection system has the disadvantage of allowing only a limited number of interconnections between different boards and furthermore it maintains very large the mean length of the interconnections between components carried by different boards and the number of movable contacts or solderings existing along each one of said connections.

The disadvantages of the previously described integration types are obviated by the modular structure according to the invention, which is characterized in that the electric connection between said main boards is achieved between superficial contact elements substantially distributed on the whole surface of the opposite faces of each pair of contiguous main boards, through connection boards interposed between said main boards.

This and other features of the invention will clearly appear from the following description of a preferred embodiment, made by way of example and not in a limiting sense, with reference to the annexed drawings, wherein.

Figure 1:
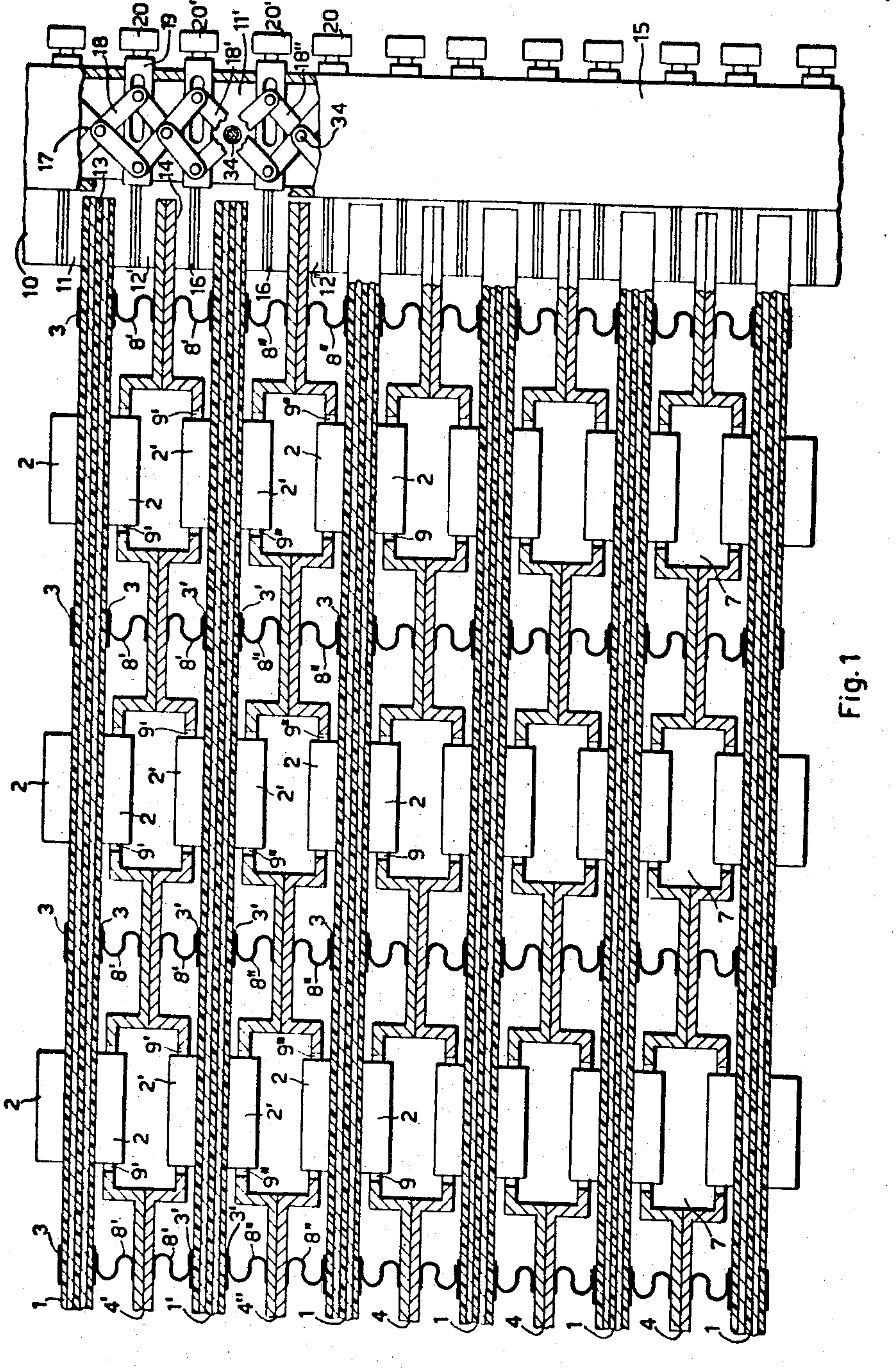
FIG. 1 is a sectional view of a modular structure according to the invention.

The modular structure according to the invention is obtained by alternately stacking detachable elements of two series. The first series of elements is constituted by main boards 1 (FIG. 1), the second series of elements is constituted by connection boards 4 having a grate shape. Therefore the mechanical and electronic configuration of an electronic system, for example of an electronic computer, made by means of a modular and integrated structure according to the invention, appears as a continuous package of layers obtained by repeatedly and alternately stacking elements of said two series.

The elements 1 of the first series appear as multilayer boards, comprising passive electric circuit elements, insulating elements and connection elements, and being externally coated with an insulating layer. These main boards (FIGS. 1 and 2) carry, at least on one of their two faces, some multicomponent blocks 2 (each one comprising a plurality of generally active electronic components, for example transistors) arrayed, on said face, in fixed and geometrically disposed positions according to a symmetric grate. Furthermore, on the whole surface of the two faces of each main board 1 contact areas 3 are disposed for allowing the connections with the contiguous main boards. Also these contact areas 3 are arrayed on geometrically fixed positions which are preferably disposed according to a regular grate.

Figure 3:
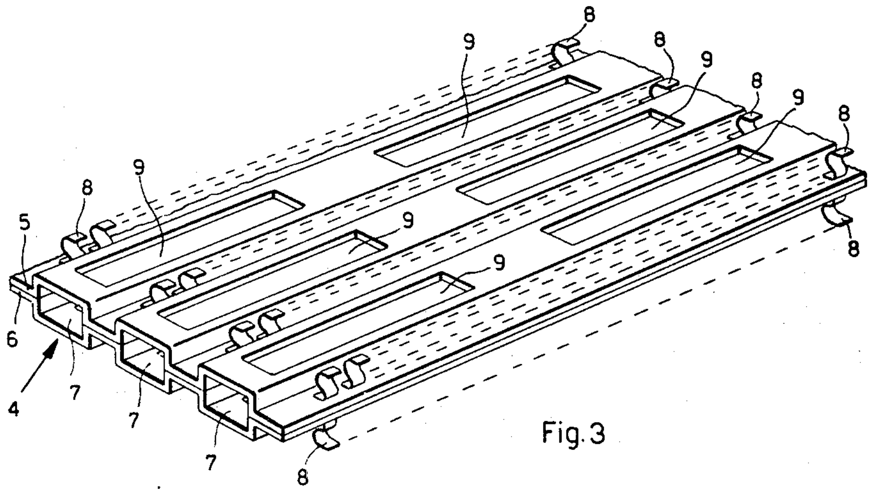
FIG. 3 is a perspective view of an interconnection board, comprised in a modular structure according to the invention.

Each one of the connection boards 4 (FIGS. 1 and 3) comprises a channelled frame, for example obtained by bonding together two bent plates 5 and 6, so as to form a board with ribs constituted by channels 7 which are parallelly disposed and equally spaced. The grate connection boards 4 may be made for example of insulating material and they carry on both their opposite faces a plurality of interconnection elements 8 of elastic and electrically conductive material, for example springs, arrayed in fixed geometric positions and arranged according to a grate coincident with one of the contact areas 3.

Said interconnection elements 8 are passing through the connection board 4, in a sense that it exists electric continuity between one interconnection element 8 secured to one face of the board 4 and an interconnection element 8 secured to the opposite face of the same board in a corresponding position. When the connection boards 4 are assembled interposed with a series of parallel and contiguous main boards, said interconnection elements 8 are elastically pressed against the contact areas 3 distributed on the surface of the adjacent facing main board, and therefore they realize an electric connection between contiguous main boards. Furthermore it is possible to realize electric connections also between elements 8 distributed on the same face of a connection board 4 by means of suitable printed circuits formed on the same face of said board.

The channels 7 are adapted to consent the flowing of air subjected to forced circulation and therefore they operate as cooling channels for the electronic system. Furthermore, the ribs constituting the channels 5 carry some openings 9 arrayed according to a symmetric grate coincident with the one of the multicomponent blocks 2.

Figure 2:
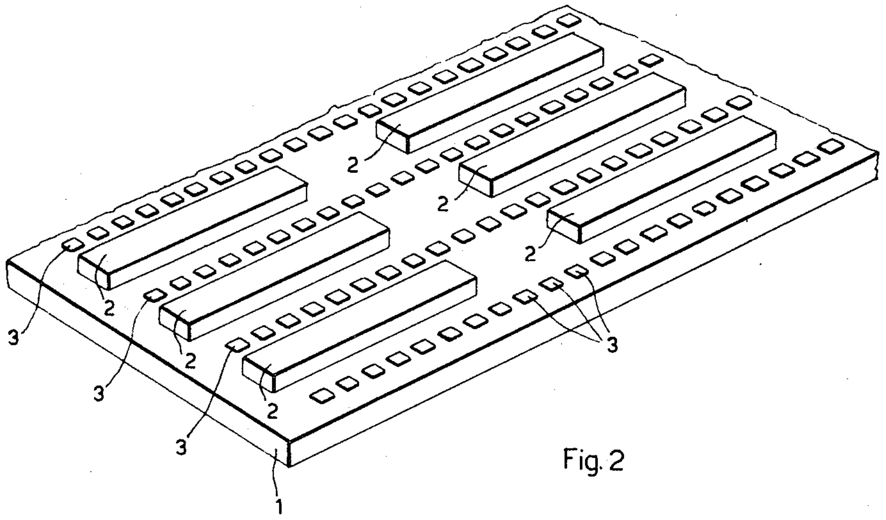
FIG. 2 is a perspective view of a main board, comprised in a modular structure according to the invention.

A mechanical frame 10 (whose right side is shown in FIG. 1) supports and keeps mechanically and electrically connected together the boards of the two series. This frame consists, for example, of a set of guides 11, 12 wherein the edges 13, 14 of the boards 1 and 4 respectively are detachably inserted; said guides of insulating materials are supported by a wall 15 and are movable with respect to the latter within two suitable side profiles. When the whole structure is being assembled, the main boards 1 and the connection boards 4 are put in contact and subjected to a certain pressure which confers rigidy to the structure and allows a permanent contact between the springs 8 and the contact areas 3. In this condition the multicomponent blocks 2 enter into the corresponding openings 9 of the contiguous connecting boards 4. The external pressure forces are opposed by the reaction of the springs 8. The external pressure is being applied on the guides 11, 12, which are maintained in tight contact (eventually separated by an elastic spacer 16) by a suitable mechanism 17 adapted to tighten and to loosen said guides.

Said mechanism 17 may for example be of the following type. A set of four-bar linkages 18, each one having two vertices pivotably connected to two contiguous guides 11, 12 respectively by means of pivots 34, is adapted to consent the forced separation and approach of said contiguous guides by means of suitable connecting clamps 19 controlled by leading screws 20.

Since the guides 11, 12 are slidable within the side profiles of the wall 15 of the supporting frame 10, the action of one leading screw 20' enables to modify the shape of the corresponding four-bar linkage 18', and therefore to put together or to separate the guides 11' and 12' connected to said four-bar linkage. The other guides 11, 12 remain joined and are only subjected to a transfer movement rigidly with the two guides 11', 12' according to they are orderly contiguous to the one or to the other guide.

Therefore at the beginning of the operations of assembling the main boards 1 and the connection boards 4 onto the frame of the support 10, all the screws 20 will be loosened so that each one guide 11, 12 becomes separated from the contiguous ones. This condition is true both for the right side of the frame 10, represented in FIG. 1, and for the left side not represented in FIG. 1. In this condition it is possible to insert the boards 1 and 4 respectively into the guides 11 and 12. Successively the screws 20 are tight so that the approach of the guides 11, 12 produces the approach of the boards 1, 4; consequently the multicomponent block 2 enters into the openings 9 of the contiguous connection boards 4, whereas the springs 8 are pressed against the contact areas 3.

When it is intended to extract a single board 1 or 4 for inspecting or replacing purposes, for example the main board 1' inserted in the guide 11', it will be sufficient to loosen (on the right and the left sides of the frame) the screws 20' and 20'' which respectively control the two four-bar linkages 18' and 18'' linked to the guide 11' in order to separate the two guides 12' and 12'' from the intermediate guide 11'. When a sufficient separation is obtained so that the blocks 2' of the main board 1' result to be drawn out of the openings 9' and 9'' of the connection boards 4 and 4'' respectively and the springs 8' and 8'' of the connection boards 4 and 4'' respectively are separated from the contact areas 3' of the main board 1', said board 1' will be easily extracted from its side guides 11' without meeting any obstacle.

In another embodiment of the mechanism giving rise to the movement of the guides, the four-bar linkages 18 may be rigidly connected to each other so that the deformation of one causes the deformation of all others. In this case only one leading screw is sufficient for the whole mechanism (one for the right side and one for the left side of the supporting frame), the actuation of which causes a forced approach or separation of all guides 11, 12 contemporaneously.

Figure 7:
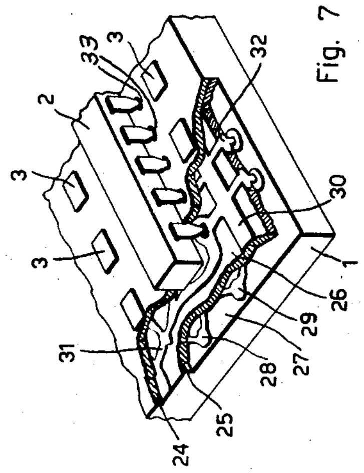
FIG. 7 is a perspective view of a part of a main board according to FIG. 2, with cross-sections at different depths.

With reference to the FIG. 7 the structure of the main boards 1 will be now more particularly described.

A main board 1 is constituted by a set of stacked layers, alternately insulated as the layers 24, 25 and not insulated as the layers 26, 27; the not insulated layers contain the passive electronic components 28, 29 and the corresponding interconnections 30, 31. The technique for obtaining these layers is known. Connections between different conductive layers may be obtained by deposition of electric circuit elements 32 passing through the separation insulating layers.

For the deposition of the electronic components of the conductive layers in the main boards care will be taken in obtaining symmetries, for example by disposing the identical components on the knots of standard grates, so as to reduce the number of masks required for the production of the conductive layers.

Particularly, when adopting a NOR logic for the circuits of an electronic computer, it will be possible to amplify the circuit symmetries and also to reach a standardisation of the circuits obtained by deposition.

The external layers of the main board 1 are insulating and bear the already mentioned contact areas 3, constituted by a thin conductive layer and connected to the circuits of the internal layers of the main board. In the configuration of each board the contact areas 3 will not effectively be located in all possible positions: said contact areas may be present or absent according to the connections required by the circuit assemblies comprised in a main board.

The particular technology adopted for the main boards 1 requires that the active electronic components, for example the transistors, have to be added successively from the outside. As it has already been explained all the monolithic components to be employed will be identical between them, each one containing an integrated assembly of identical active components, as for example transistors, which are generally independent between them.

Figure 5:
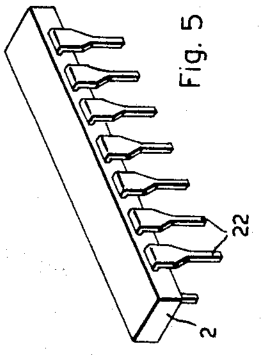
FIGS. 4, 5 and 6 show different embodiments of active electronic components grouped in monolithic elements, comprised in a modular structure according to the invention.
Figure 4:
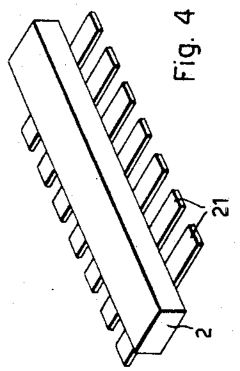
Figure 6:
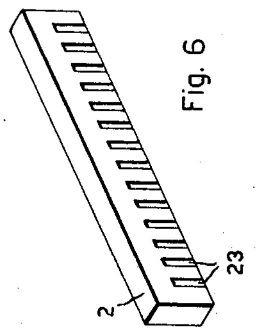

In the FIGS. 4, 5 and 6 different possible embodiments of said monolithic multicomponent elements are shown. Each monolithic multicomponent element has the shape of a block having as many projecting terminals as the total number of terminals of the components constituting them; particularly, if it comprises a group of transistors, it will generally have a pair of terminals for each component transistor plus a terminal common to all component transistors.

In FIG. 4 the terminals of the monolithic multicomponent element consist of flat contact strips 21 secured to the base of the block 2 and located in parallel way with respect to the same base. The type of multicomponent element shown in FIG. 4 enables to perform electric connections with the circuits of the main board 1 and to connect it mechanically to the same board by placing said flat contact strips 21 on the contact areas 3 or on other suitable superficial contact elements carried by the same board. Said connections may be obtained by means of electron beam soldering or by thermocompression.

In FIG. 5 the terminals of the monolithic multicomponent element are constituted by a plurality of tongues 22 projecting from the block 2 and bent so that their ends are parallel each other and perpendicular with respect to the base face of the block. For arranging elements of the type of FIG. 5 onto main boards 1 it is necessary that the same boards are provided with suitable holes 33 wherein the ends of said tongues 22 are plugged-in; the mechanical fixing and the electric connection with the circuits of the same boards is then achieved by casting a suitable soldering material into said holes.

In FIG. 6 the terminals of the monolithic multicomponent element are constituted by conductive areas 23 orderly arrayed on two opposite faces of the block 2. For the attachment and the connection of elements of the type shown in FIG. 6 onto the main boards 1 it is generally necessary that said boards carry a suitable female connector in each position wherein a multicomponent element will be inserted; the male connector will be constituted by the same multicomponent block the conductive areas of which will engage the corresponding contact elements of said female connector.

The embodiment described for the main boards 1 has the advantage to allow an integration of the circuits of an electronic machine by active components of general and conventional type, and therefore of minimum cost, preventing the adoption of special monolithic integrated circuits which, besides the high cost, also show the disadvantage of a lower operation reliability due to their complexity and of a shorter duration. The use of identical monolithic elements containing a plurality of identical active components shows another advantage with respect to the monolithic integrated circuits, consisting in the ease and economy of the maintenance and replacement operations. Finally, the embodiment described for the main boards shows the advantage of a completely automatic execution of the manufacturing process.

Furthermore, it is to be noted that the solution of having the multicomponent blocks 2 inserted in the openings 9 of the contiguous connection boards, when the packaging under pressure of the different assembled boards are achieved, makes possible an efficient dissipation of the thermal energy developed by the transistors comprised in the blocks 2, by means of a forced air circulation through the channels 7 of the connection boards.

Furthermore, the main boards 1 may bear, along the edges not engaged with the support guides 11, some connectors so as to enable the connection with possible interconnection sideboards. To this end it will be sufficient to apply a method which is analogous to the one described in the U.S. patent application Ser. No. 505,147 to applicant and Edoardo Ecclesia, Electronic Circuit Modules and Modular Assembly, including the same, filed Oct. 25, 1965, and of common ownership.

Finally, it is to be noted that modular structure according to the invention realizes interface connections between the main boards which bear the circuit assemblies and, therefore, it may eliminate the use of connectors located along an edge of the board, as they are used in the known interconnection systems. In comparison with respect to the known systems the structure according to the invention allows to obtain a larger number of connections between different boards, because the connections are substantially distributed on the whole surface of the two faces of each board and not only along one of its edges. Furthermore, the structure according to the invention allows to reduce both the mean length of the connections between components carried by the different boards and the number of movable contacts or soldering that are present along each one of said connections.

What I claim is:

1. Modular structure for electronic integrated circuits comprising:

(a) a plurality of parallelly disposed main boards supported on a frame and bearing interconnected active and/or passive electronic components and superficial contact elements substantially distributed on the whole surface of the two opposite faces of each main board;

(b) connection boards interposed between said main boards and parallelly disposed thereto;

(c) means whereby each one of said main boards and of said connection boards is detachable with respect to the others from the supporting frame;

(d) each main board being constituted, in a known manner, by a plurality of layers;

(e) each connection board being provided with a plurality of interconnection elements substantially distributed on the whole surface of the two opposite faces of each connection board and elastically compressible against said superficial contact elements, and means whereby said interconnection elements electrically pass through said connection boards.

2. Modular structure according to claim 1, wherein each one of said connection boards is provided with a plurality of cooling channels parallelly disposed with respect to said main boards.

3. Modular structure according to claim 1, wherein each main board is constituted by a plurality of layers comprising elements of passive electric circuits, insulating elements and connection elements, and wherein said active electronic components are grouped in identical monolithic elements, each one containing only identical active components, each monolithic element being electrically and mechanically connected to the respective board by means of a soldering.

4. Modular structure according to claim 3, wherein cooling channels are provided with openings which lodge said monolithic elements, when said main boards and said connection boards are packaged.

5. Modular structure according to claim 2 wherein said connection boards consist of two plates bent and soldered to form said cooling channels.

References Cited

UNITED STATES PATENTS

| | | | |
|---|---|---|---|
| 2,731,609 | 1/1956 | Sobel | 317—101 |
| 2,931,003 | 3/1960 | Huetten et al. | 317—101 |
| 3,289,045 | 12/1966 | Pritikin et al. | |
| 3,303,393 | 2/1967 | Hymes et al. | 317—101 |
| 3,348,102 | 10/1967 | Bosland et al. | 317—112 |

OTHER REFERENCES

IBM Technical Disclosure Bulletin, "Multilayer Electronic Package," Beverly and Crumb, vol. 8, No. 10, March 1966, pp. 1325 and 1326.

ROBERT K. SCHAEFER, *Primary Examiner.*

M. GINSBERG, *Assistant Examiner.*

U.S. Cl. X.R.

317—101